(12) United States Patent
Ito

(10) Patent No.: US 8,460,046 B2
(45) Date of Patent: Jun. 11, 2013

(54) ORGANIC FUNCTIONAL ELEMENT AND METHOD FOR MANUFACTURING SAME

(75) Inventor: Nobuyuki Ito, Tokyo (JP)

(73) Assignee: Dai Nippon Printing Co., Ltd., Tokyo-to (JP)

(*) Notice: Subject to any disclaimer, the term of this patent is extended or adjusted under 35 U.S.C. 154(b) by 0 days.

(21) Appl. No.: 12/908,367

(22) Filed: Oct. 20, 2010

(65) Prior Publication Data

US 2011/0030912 A1    Feb. 10, 2011

Related U.S. Application Data

(62) Division of application No. 10/583,018, filed as application No. PCT/JP2004/018498 on Dec. 10, 2004, now abandoned.

(30) Foreign Application Priority Data

| Dec. 16, 2003 | (JP) | ................................ 2003-417552 |
| Mar. 3, 2004 | (JP) | ................................ 2004-058884 |
| May 6, 2004 | (JP) | ................................ 2004-136983 |

(51) Int. Cl.
  *H01J 9/227* (2006.01)
(52) U.S. Cl.
  USPC .......................................................... 445/24
(58) Field of Classification Search
  USPC .................................................... 445/24–26
  See application file for complete search history.

(56) References Cited

U.S. PATENT DOCUMENTS

| 4,810,308 A | 3/1989 | Eagar et al. |
| 4,885,211 A | 12/1989 | Tang et al. |
| 4,998,665 A | 3/1991 | Hayashi |
| 5,120,498 A | 6/1992 | Cocks |
| 6,160,346 A | 12/2000 | Vleggaar et al. |
| 2002/0011783 A1 | 1/2002 | Hosokawa |
| 2002/0051893 A1 | 5/2002 | Gao et al. |
| 2002/0079832 A1 | 6/2002 | Van Tongeren et al. |

FOREIGN PATENT DOCUMENTS

JP    64-7635 A    2/1989

(Continued)

OTHER PUBLICATIONS

USPTO OA mailed Apr. 29, 2008 in connection with U.S. Appl. No. 10/583,018.

(Continued)

*Primary Examiner* — Anh Mai
*Assistant Examiner* — Brenitra M Lee
(74) *Attorney, Agent, or Firm* — Ladas & Parry LLP

(57) ABSTRACT

The object of the invention is to provide a highly reliable organic functional element such as an organic EL element or an organic semiconductor element exemplified by an organic TFT element which can be manufactured without requiring a vapor deposition process for forming an electrode on an organic material layer. Consequently, such an organic functional element can be large-sized easily and produced at lower cost. In addition, no damage is caused to the organic material layer during formation of the electrode, and the organic functional element is not affected by environmental changes. Also disclosed is a method for manufacturing such an organic functional element. To attain the above-mentioned object, the present invention provides an organic functional element comprising at least a plurality of electrodes and an organic material layer which is characterized in that at least one of the electrodes is composed of a metal having a melting point not higher than a temperature that is higher by 30° C. than the glass transition temperature of the organic material layer.

6 Claims, 11 Drawing Sheets

HEATING, MELTING AND APPLICATION OF METAL

FOREIGN PATENT DOCUMENTS

| | | |
|---|---|---|
| JP | 02-015595 A | 1/1990 |
| JP | 09-320763 A | 12/1997 |
| JP | 10-012381 A | 1/1998 |
| JP | 11-329746 A | 11/1999 |
| JP | 3239991 | 10/2001 |
| JP | 2002-237382 A | 8/2002 |
| JP | 2002-540591 A | 11/2002 |

OTHER PUBLICATIONS

USPTO OA mailed Jan. 5, 2009 in connection with U.S. Appl. No. 10/583,018.
USPTO OA mailed Jul. 29, 2009 in connection with U.S. Appl. No. 10/583,018.
USPTO OA mailed Apr. 22, 2010 in connection with U.S. Appl. No. 10/583,018.
International Search Report: PCT/JP2004/018498.

ARRANGEMENT OF METAL

HEATING, MELTING AND COOLING

HEATING, MELTING AND APPLICATION OF METAL

COOLING

APPLICATION OF METAL PASTE

HEATING, MELTING AND COOLING

HEATING AND MELTING

TRANSCRIPTION

COOLING

HEATING AND VACUUM DRAWING

OPENING TO THE AIR

COOLING

ORGANIC FUNCTIONAL ELEMENT AND METHOD FOR MANUFACTURING SAME

TECHNICAL FIELD

The present invention relates to an organic functional element, particularly an organic semiconductor element, an organic thin film transistor element (hereinafter, "thin film transistor" is referred to as "TFT"), an organic electroluminescence element (hereinafter, "electroluminescence" is referred to as "EL"), and a method for manufacturing the same.

BACKGROUND ART

In recent years, flat display apparatus (flat displays) are used in many fields and places, and have increasing importance with the progress of information technology. A typical example of the flat display at present is a liquid crystal display (also referred to as "LCD"), and as flat displays based on a displaying principle different from that of the LCD: an organic EL display, an inorganic EL display, a plasma display panel (also referred to as "PDP"), a light emitting diode display apparatus (also referred to as "LED"), a vacuum fluorescent display apparatus (also referred to as "VFD"), a field emission display (also referred to as "FED"), and so on are also actively developed. These new flat displays, which are referred to as self light emitting type displays, are significantly different from the LCD in the following respects and have excellent characteristics absent from the LCD.

The LCD is referred to as light receiving type display, wherein the liquid crystal itself does not emit any light and acts as a shutter for transmitting and shielding an external light to constitute a display. Accordingly, the LCD requires a light source and generally needs a backlight. On the other hand, the self light emitting type display emits a light by itself and thus does not require any other light source. In the light receiving type display such as the LCD, the backlight is always lighted regardless of the mode of displayed information, thus consuming almost the same power as in the full displaying state. The self light emitting type display, on the other hand, consumes power only in a place where lighting is necessary depending on display information, so there is principally an advantage in less consumption of power compare to the light receiving type display.

The LCD attains the state of darkness by cutting off the light of a backlight source, upon which the complete prevention of light leakage is hardly attained, while the self light emitting type display in a state not emitting a light is in the state of darkness, thus easily attaining an ideal state of darkness. Accordingly, the self light emitting type display is also significantly superior in respect of contrast.

Since the LCD utilizes regulation of polarized light by birefringence of liquid crystal, the state of display changes depending on the viewing direction, that is, the LCD has strong viewing angle dependence. This problem, on the other hand, hardly occurs in the self light emitting type display.

Further, the LCD utilizes a change in orientation derived from the dielectric anisotropy of the liquid crystal that is an organic elastic substance, and thus the time of response to an electric signal is principally 1 millisecond or more. On the other hand, the above-described techniques under development utilize transfer of carries such as electron/hole, electron emission and plasma discharge, and thus the time of response to an electric signal is as short as the nanosecond level that is such a high speed as not to be comparable with that of liquid crystal, and therefore, there is none of the problem of an afterimage of a motion picture attributable to the slow response of the LCD.

Among these, the organic EL is particularly actively studied. The organic EL is also called OEL (organic EL) or OLED (organic light emitting diode).

The OEL element and OLED element have the structure in which a layer containing an organic compound (EL layer) is sandwiched between a pair of an anode and a cathode, which is based on a layered structure of "anode/hole injection layer/light emitting layer/cathode" of Tan et al. (see, for example, patent document 1). While Tan et al. use a low-molecular material, Henry et al. use a high-molecular material (see, for example, patent document 2).

The efficiency is improved by using a hole injection layer or an electron injection layer, and the color of emission light is regulated by doping the light emitting layer with a fluorescent dye or the like. The organic EL attains high brightness at a relatively low voltage of 10 V or less, so its application as a lighting apparatus as a substitute for a fluorescent light which is problematic due to use of mercury is also expected.

FIG. 9 is a schematic view showing a fundamental sectional structure of a conventional organic EL element 51.

The organic EL emits a light by applying an electric field between the electrodes to apply an electric current through the EL layer. Conventionally, fluorescence emission occurring upon return from a singlet excited state to a ground state has been utilized, but recent studies enable to utilize fluorescence emission occurring upon return from a triplet excited state to a ground state effectively to improve efficiency significantly.

Usually, the organic EL element 51 is produced by forming a transparent electrode on a translucent substrate 52 such as glass substrate or plastic substrate and then forming a light emitting layer 54 i.e. an EL layer and a counter electrode in this order. Generally, from the work function of the transparent electrode such as ITO relative to the energy level of the EL layer, the transparent electrode is often used as anode 53 and a metal is often used as the counter electrode to form a cathode 55. In the organic EL element 51 described above, an emitted light 58 can be confirmed at the side of the transparent electrode 53. It is known that in the organic EL element 51, a hole injection layer 56 and an electron injection layer 57 are arranged respectively between the EL layer and the electrode as needs arise, and the electrode thereby attaining excellent effects for higher efficiency and a longer life.

In this specification, the hole injection layer and the hole transportation layer, or the electron injection layer and the electron transportation layer, are intended to be synonymous with each other.

Generally, the method of forming the EL layer employs a vapor deposition process using a mask in case of a low-molecular material is used as a material of the EL layer, while when a high-molecular material is used, its solution is applied in an ink jet method, spin coating method, printing method, transfer method or the like.

In recent years, a coatable low-molecular material is also reported. Among the methods described above, the method of vapor deposition of the low-molecular material with a mask is limited because of difficulty in large-sizing of the vacuum apparatus and the vapor deposition mask, so there is a problem of difficulty in large-sizing and in preparation of a large number of sheets by using large substrates. This is not problematic for trial manufacture in the stage of development, but indicates poor competitiveness in the market in respect of tact and cost in the full-scale manufacturing stage. On the other hand, the high-molecular material or the coatable low-molecular material can be formed into a film by a wet process such as an ink jetting method, printing method, casting method, alternate adsorption method, spin coating method and dip coating method. Accordingly, it is less problematic for coping with the large substrate and the coating process is promising as a method of forming the organic EL element.

Now, the method for manufacturing the organic EL element shown in FIG. 9 is described.

By sputtering or vacuum vapor deposition of a transparent electroconductive film of ITO or IZO onto a transparent substrate, a transparent electrode can be produced separately from production of an organic EL. On the transparent electrode, for example, the high-molecular organic EL material described in the patent document 2, that is, PPV (polyphenylene vinylene), is dissolved in an organic solvent and spin-coated. Finally, a metal of low work function such as Al or Ag is formed into a film by vapor deposition to give a cathode.

In the manufacturing method described above, however, since the cathode is formed by vapor deposition, a large-scale vacuum apparatus is necessary only for this step, and for vacuum drawing, the production tact is delayed. As a result, there is a problem that the characteristics of the organic EL material that can be coated to form a film cannot be fully utilized.

Against the problem that the superiority of the coating process for the organic material cannot be fully utilized in forming an electrode by vapor deposition, there is proposed an organic EL element having a cathode formed by melting a metal as well as a method for manufacturing the same (see, for example, patent document 3).

A substance of low work function has an excellent electron injection effect, and in this respect, an alkali metal and an alkaline earth metal are most suitable. Use of an alloy composed of an alkali metal or an alkaline earth metal and another metal in an electron injection electrode for an organic EL element has been proposed for an organic EL element produced by conventional vapor deposition or the like (see, for example, patent documents 4, 5 and 6).

However, all low-melting point metals (alloy compositions) usable as the cathode described in the patent document 3 are alloys containing Sn, and any alloys described therein have a melting point over 160° C., as shown in Table 1 in the patent document 3. The patent document 3 also describes that in addition to those shown in Table 1, metals such as Ga, K, Cs and Rb can be used, but Ga, K, Cs and Rb are metals having very low melting points of 29° C., 63° C., 28° C. and 38° C., respectively.

The patent document 3 supra also describes a method of coating a molten metal onto an anode substrate produced from an EL layer, but does not show any specific method for coating the metal in a heated and molten state. The patent document 3 also describes a method wherein an electroconductive paste is printed on an EL layer and then cured by heating to 175° C. As the electroconductive paste, a silver paste is used, and the melting point of silver is as high as 960° C. In this case, the paste resin is merely thermally cured, and it is evident that the metal silver is not melted.

In organic functional elements such as an organic EL element, selection of the melting point of the metal in the electrode is practically very important. As shown in the patent document 3 supra, a metal of very high melting point and a metal of very low melting point cause the following problem. That is, when the melting point of the metal serving as an electrode is high, the high-temperature stability of the organic material layer at the time of forming the electrode is problematic, and a heating temperature significantly higher than the glass transition temperature of the organic material layer causes a problem of seriously affecting the organic material layer.

On the other hand, when the melting point of the metal serving as an electrode is low, the storage stability thereof as a functional element becomes problematic. In an environment such as inside of automobile in summer, for example, the temperature inside the automobile is significantly increased, and when the organic EL element is used as a display apparatus where a low-melting metal serves as an electrode, there is a problem that the electrode is melted due to high temperatures to break the apparatus.

In the foregoing, the organic EL element has been described, but an organic functional element composed of an organic functional material as an organic material layer and electrodes has the same problem.

The alkali metal and alkaline earth metal in organic EL elements described in the patent documents 4, 5 and 6 are strongly oxidative, combustible and unstable in the air and are thus difficult to handle, so they can be formed into a film only under vacuum by vapor deposition, or the like.

In the techniques described in the patent documents 4, 5 and 6 supra, for example an alloy region containing an alkali metal or an alkaline earth metal is formed in the vicinity of a light emitting layer by co-vapor deposition with plurality kinds of metals as independent vapor deposition sources, to form an electrode by vacuum vapor deposition. Other techniques use an alloy of an alkali metal or an alkaline earth metal and another metal, but the electrode is formed by vapor deposition or sputtering of the alloy as a target material; and although the alloy is used, the electrode is produced by the vapor deposition process or sputtering method. This is because there is a problem that the electrode cannot be produced without using the vacuum vapor deposition process since the melting point of the metal used is high.

Patent document 1: Japanese Patent No. 1526026
Patent document 2: Japanese Patent No. 3239991
Patent document 3: Japanese Patent Application Laid-Open (JP-A) No. 2002-237382
Patent document 4: JP-A No. 9-320763
Patent document 5: JP-A No. 10-12381
Patent document 6: JP-A No. 11-329746

DISCLOSURE OF THE INVENTION

Problem to be Solved by the Invention

The present invention was achieved in view of the above-mentioned problems. The object of the invention is to provide a highly reliable organic functional element such as an organic EL element or an organic semiconductor element exemplified by an organic TFT element which can be manufactured without requiring a vapor deposition process for forming an electrode on an organic material layer. Consequently, such an organic functional element can be large-sized easily and produced at lower cost. In addition, no damage is caused to the organic material layer during formation of the electrode, and the organic functional element is not affected by environmental changes. Also disclosed is a method for manufacturing such an organic functional element.

Means for Solving the Problem

To attain the above-mentioned object, the present invention provides an organic functional element comprising at least a plurality of electrodes and an organic material layer, wherein at least one of the electrodes is composed of a metal having a melting point not higher than a temperature that is higher by 30° C. than the glass transition temperature of the organic material layer.

In the present invention, a low-melting metal which melts at a temperature lower than a temperature not significantly higher than the glass transition temperature of an organic material layer such as an organic semiconductor layer, an organic light emitting layer, or the like is used in at least one of electrodes constituting an organic functional element such as an organic EL element, an organic TFT element, an organic semiconductor element, or the like, thereby forming an electrode without using vapor deposition. This is because when the melting temperature of the electrode metal is higher by over 30° C. than the glass transition temperature of an organic material layer such as an organic light emitting layer, an organic semiconductor layer, or the like, the organic material layer such as organic light emitting layer, organic semiconductor layer, or the like is seriously affected.

The organic functional element of the present invention comprises at least a plurality of electrodes and an organic material layer, wherein at least one of the electrodes is composed of a metal having a melting point of 70° C. or higher that is higher by 30° C. than the glass transition temperature of the organic material layer.

To allow the organic EL element that is an organic functional element to be used stably even under a high-temperature environment such as inside of automobile in summer, the melting point of a metal used as the electrode is practically 70° C. or higher. In case of the melting point is lower than 70° C., there arises a problem of melting by heating. This is a serious problem particularly for the organic EL element because it is often utilized in a display and is hardly packaged or subjected to cooling or the like unlike other organic functional elements.

The organic functional element of the present invention comprises at least a plurality of electrodes and an organic material layer, wherein at least one of the electrodes is composed of a metal having a melting point of 70° C. or higher to 160° C. or lower.

This is because when the melting point of the electrode metal is over 160° C., the organic material layer such as organic light emitting layer or the like is significantly affected at the time of electrode formation.

The organic functional element of the present invention is characterized in that the metal constituting the electrode is an alloy of Bi and at least one kind of other metals.

In a preferable embodiment, the organic functional element of the present invention is characterized in that a Bi component in the metal constituting the electrode is greater than that of the at least one kind of other metals. The organic functional element is also characterized in that the metal constituting the electrode is an alloy composed of Bi and one, two, three, four or five kinds of metals selected from the group composed of Sn, Pb, Cd, Sb and In.

Another organic functional element of the present invention is characterized in that the metal constituting the electrode is an alloy of Sn and Bi, and the Sn component is greater than the Bi component.

A further other organic functional element of the present invention is characterized in that the metal constituting the electrode is an alloy of In and Sn.

In the present invention, the organic functional element is an organic EL element or either an organic TFT element or an organic semiconductor element and has one of the electrodes described above. In the case of the organic EL element, said electrode is a cathode.

Particularly in the organic EL element, use of the alloy based on Bi as the electrode is also advantageous in that injection of electrons from the cathode to the EL layer is improved. From the viewpoint of easy releasing of electrons, a metal of low work function is used in the cathode, and generally, Al with a work function of 4.2 eV is often preferably used as typical metal. In the present invention, Bi that is a main component of the electrode metal has work function near to that of Al, and for example the work function of an alloy of Bi—Pb—Sn (ratio of 50:25:25% by weight) is 4.1 eV that is almost the same as that of Al.

Particularly in the organic EL element, use of the alloy based on In as the electrode is also advantageous in that injection of electrons from the cathode to the EL layer is improved. The work function of In is also 4.1 eV that is almost the same as that of Al.

For the organic EL element, the electron injection layer is important for manufacturing the element that is practical in respect of properties such as voltage, brightness and efficiency. In other organic functional elements such as organic TFT element, the electrode having an excellent electron injection function is also important for the ability to regulate a larger electric current.

The organic functional element of the present invention is composed of at least a plurality of electrodes and an organic materials layer, wherein at least one of the electrodes is composed of a metal containing an alkali metal or an alkaline earth metal, and the melting point of the metal is 200° C. or lower.

In the present invention, metals having a melting point which is a temperature suitable for the organic functional material are used as the electrode as described above, and an alkali metal or an alkaline earth metal is contained in these metals thereby giving an electrode material metal excellent in stability with a high electron injection function. As a result, an organic functional element having further excellent properties can be produced.

The organic functional element of the present invention is characterized in that the metal constituting the electrode is an alloy composed of Bi and at least one kind of other metals, and containing both: one, two, three, four or five kinds of metals selected from a group composed of Sn, Pb, Cd, Sb and In and at least one kind of the alkali metal or alkaline earth metal, wherein the Bi component is greater than that of the other metals.

Another organic functional element of the present invention is characterized in that the metal constituting the electrode is an alloy of Sn and Bi and further comprises at least one kind of the alkali metal or alkaline earth metal, wherein the Sn component is greater than the Bi component.

Another organic functional element of the present invention is characterized in that the metal constituting the electrode is an alloy of In and Sn and further comprises at least one kind of the alkali metal or alkaline earth metal.

The organic functional element of the present invention is characterized in that one kind of the alkali metal or alkaline earth metal is 0.01 to 1% by volume, preferably 0.05 to 0.5% by volume. Further, a preferable embodiment is characterized in that one kind of the alkali metal or alkaline earth metal is 0.01 to 1% by weight, preferably 0.05 to 0.5% by weight. A preferable alkali metal or alkaline earth metal is selected from the group composed of Ca, Li, Cs, Mg and Sr.

As described above, the organic functional element of the present invention is characterized in that it is an organic functional element composed of at least a plurality of electrodes and an organic material layer, and at least one of the electrodes is composed of a metal containing the above-described alkali metal or alkaline earth metal and having a melting point of 200° C. or lower which is a temperature suitable for the organic functional material.

The low-melting metal described in the JP-A No. 2002-237382 supra does not contain an alkali metal necessary for a high electron injection function, and any alkali metal-containing metals as the source of vapor deposition described in the JP-A Nos. 9-320763, 10-12381 and 11-329746 supra have melting points higher than that of the present invention and cannot be formed by melting. In the present invention, the alkali metal-containing metal itself having a low melting point of 200° C. or lower utilized as the electrode of the organic functional element is a novel substance.

The organic functional element of the present invention is characterized in that a gap made between the organic material layer and a base material having a concave part opposite to the organic material layer is filled and formed with the above-mentioned metal.

Another organic functional element of the present invention is characterized in that the base material having a concave part has one or more opening parts, and the opening parts are sealed with a hardened metal.

Another method for manufacturing the organic functional element of the present invention is characterized in coating the organic material layer with a particle paste of a metal constituting at least one of the electrodes and melting and cooling the particle paste to form an electrode. In the method for manufacturing the organic functional element according to the present invention, the organic functional element is an organic EL element or either an organic TFT element or an organic semiconductor element.

Another method for manufacturing the organic functional element of the present invention is characterized in that a base material having a concave part wherein the metal constituting at least one of the electrodes is melted and maintained is opposed to, and pressed against, a substrate having the organic material layer formed thereon, such that the organic material layer is contacted with the metal, followed by transferring the metal to the organic material layer and cooling it to form an electrode.

Another method for manufacturing the organic functional element of the present invention is characterized in that the gap is made between the organic material layer and the base material having the concave part provided with the one or more opening parts opposite to the organic material layer, and the metal constituting at least one of the electrodes is melted and injected through the opening part into the gap and cooled to form an electrode.

Another method for manufacturing the organic functional element of the present invention is characterized in that vacuum injection method composed of arranging a metal in the opening part, evacuating the gap and its surrounding predetermined space, and opening the surrounding space onto the air in this order is carried out to inject the metal into the gap and thereby forming the electrode.

Another method for manufacturing the organic functional element of the present invention is characterized in that arrangement of the metal in the opening part and suction of the gas in the gap through another opening part not provided with the metal are carried out in this order thereby injecting the metal into the gap to form the electrode. That is, a vacuum injection method and a method of suctioning the gas in the gap.

Another method for manufacturing the organic functional element of the present invention is characterized in that formation of the electrode by the vacuum injection method or formation of the electrode by the suction of the gas in the gap is carried out in an inert gas.

Another method for manufacturing the organic functional element of the present invention is characterized in that the inert gas is a nitrogen, an argon, or a mixed gas of a nitrogen and an argon.

Another method for manufacturing the organic functional element of the present invention is characterized in including a base material having a concave part with the opening part sealed by cooling and hardening the molten metal.

Another method for manufacturing the organic functional element of the present invention is characterized that the electrode is formed in a predetermined form depending on the shape of the concave part and the gap.

Another method for manufacturing the organic functional element of the present invention is characterized that the concave part and the gap have a plurality of striped shapes.

Another method for manufacturing the organic functional element of the present invention is characterized that the base material having the concave part is made of one kind of member selected from the group composed of a glass, a metal, a ceramics and a resin, or a composite material of two or more thereof.

In the method for manufacturing the organic functional element according to the present invention, the organic functional element is an organic EL element or either an organic TFT element or an organic semiconductor element.

Effect of the Invention

According to the present invention, an electrode is formed on an organic material layer without using a vacuum film making method such as vapor deposition, whereby organic functional elements, particularly an organic EL element, an organic TFT element and the like can be manufactured. These functional elements can be large-sized easily and produced at lower cost. The organic material layer is not affected during formation of the electrode, and the organic functional element having high reliability without being affected by environmental changes can be realized.

The organic functional element of the present invention can be manufactured under vacuum or in an inert gas, and thus the emission uniformity of the light emitting surface can be further improved. The shape of the electrode can be arbitrarily regulated to further improving the degree of completion as the light emitting element. The element can also be completed by cooling and hardening a molten metal to close opening parts thereby simultaneously performing sealing.

Figure 1A:
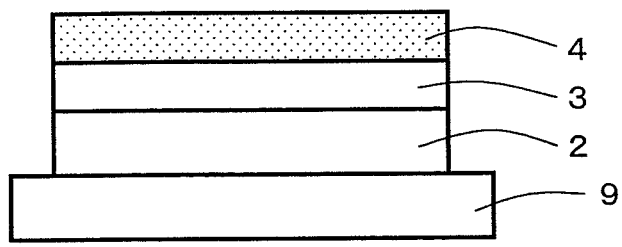
FIGS. 1A to 1D are a schematic view showing the basic concept and a view showing the manufacturing step of the organic EL element of the present invention in one embodiment.
Figure 1B:
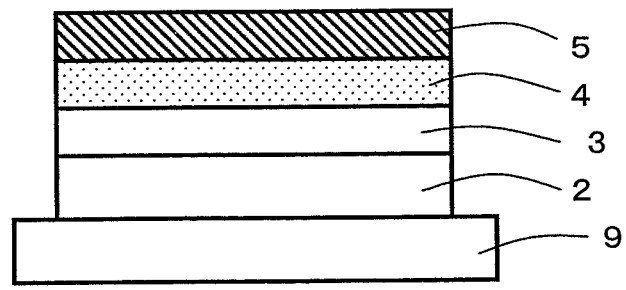
Figure 1C:
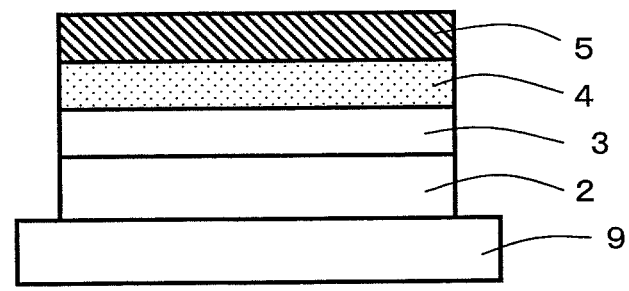
Figure 1D:
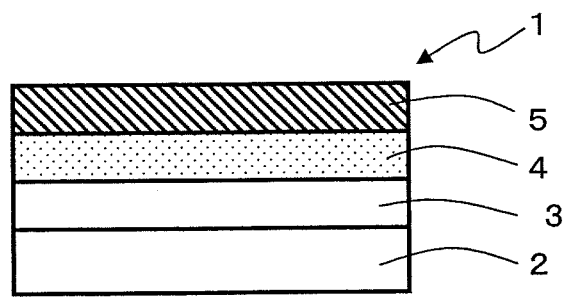
Figure 2A:
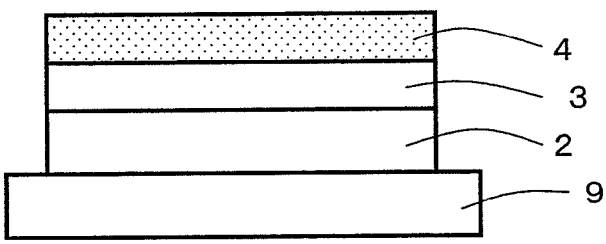
FIGS. 2A to 2D are a view showing another method for manufacturing the organic EL element of the present invention.
Figure 2B:
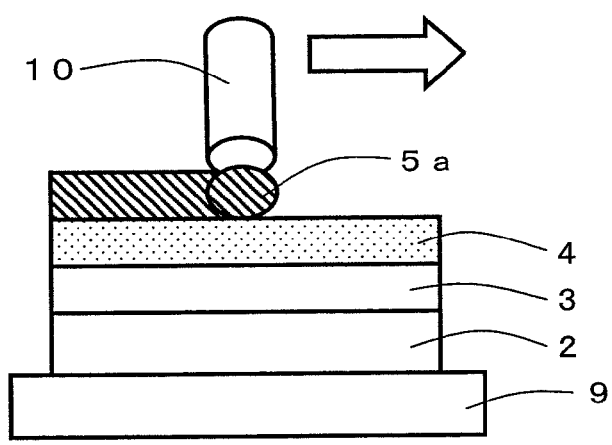
Figure 2C:
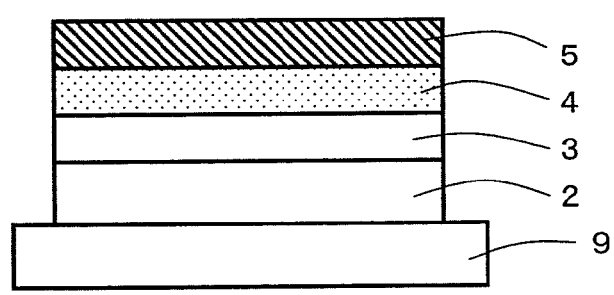
Figure 2D:
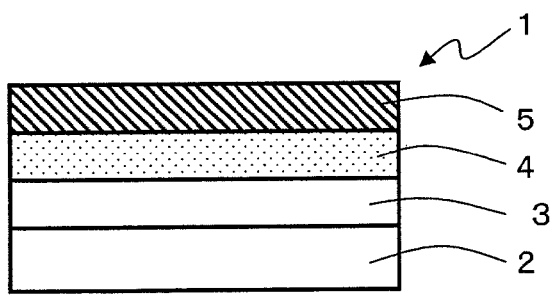
Figure 3A:
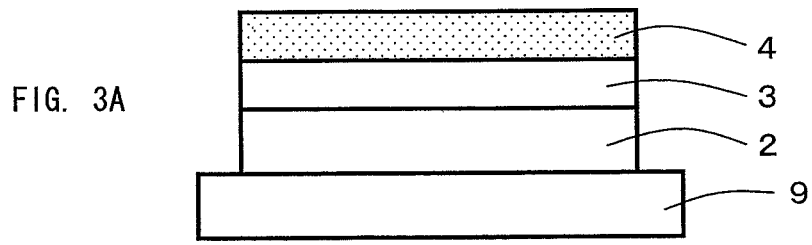
FIGS. 3A to 3D are a view showing the method for manufacturing the organic EL element of the present invention.
Figure 3B:
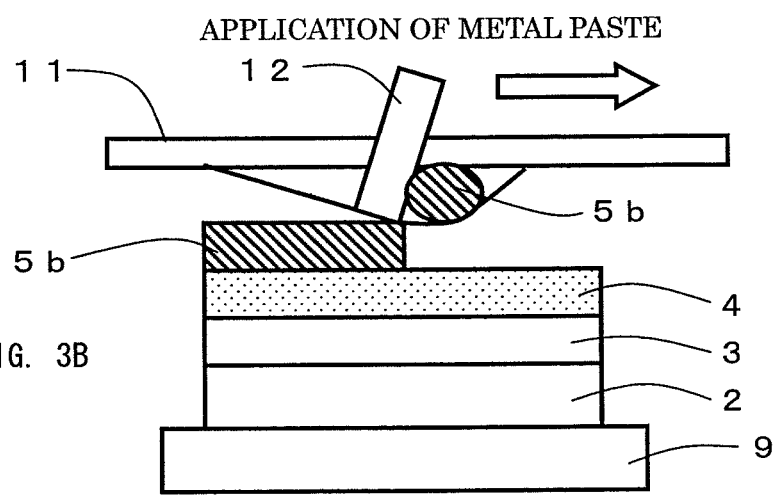
Figure 3C:
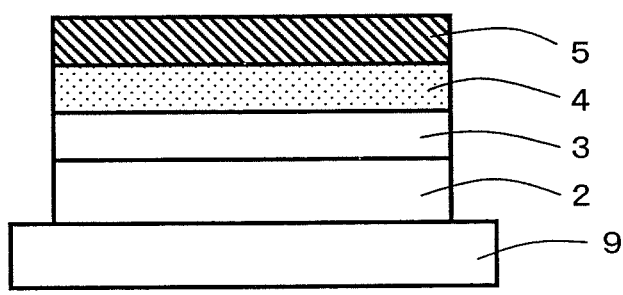
Figure 3D:
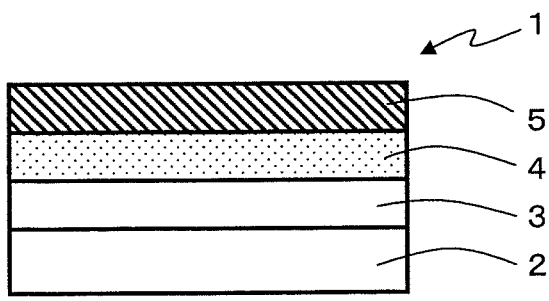

| Explanation of references | |
|---|---|
| 1, 51: | organic EL element |
| 2, 52: | substrate |
| 3, 53: | transparent electrode (anode) |
| 4, 54: | light emitting layer |
| 5, 55: | metallic electrode (cathode) |
| 5a: | molten metal |
| 5b: | metal paste |
| 6, 56: | hole injection (transport) layer |
| 7, 57: | electron injection (transport) layer |
| 58: | light emission |
| 9: | hot plate |
| 10: | dispenser |
| 11: | screen plate |
| 12: | squeegee |
| 13: | displaying part |
| 14: | operation part |
| 15: | apparatus |
| 16: | lens part |
| 17: | gate electrode |
| 18: | source electrode |
| 19: | drain electrode |
| 20: | organic semiconductor layer |
| 21: | insulating layer |
| 22: | base material having a concave part |
| 22a: | gap |
| 23: | opening part |
| 24: | suction of gas |
| 25: | heat-resistant container |
| 26: | packing |
| 27: | partition wall member |
| 28: | sealing material |
| 29: | stripe part |

BEST MODE FOR CARRYING OUT THE INVENTION

The mode for carrying out the invention is described in more detail with reference to the drawings.

In the present invention, the compositions and melting points of metal alloys used as the electrode in the present invention are shown in Table 1.

TABLE 1

| No | Alloy content (% by weight) | Melting point (° C.) |
|---|---|---|
| 1 | Bi—Pb—Sn (50:25:25%) | 93 |
| 2 | Bi—Pb—Sn (50.0:31.2:18.8%) | 94 |
| 3 | Bi—Pb—Sn (50.0:28.0:22.0%) | 100 |

TABLE 1-continued

| No | Alloy content (% by weight) | Melting point (° C.) |
|---|---|---|
| 4 | Bi—Pb—Sn—Cd (40.0:40.0:11.5:8.5%) | 130 |
| 5 | Bi—Pb—Sn—Sb (47.7:33.2:18.8:0.3%) | 130 |
| 6 | Bi—Pb—Sn—Cd (50.0:26.7:13.3:10.0%) | 70 |
| 7 | Bi—Pb—Sn—Cd (50.0:25.0:12.5:12.5%) | 72 |
| 8 | Bi—Cd (60.0:40.0%) | 144 |
| 9 | Bi—Cd—In (60.0:35.5:5.0%) | 137 |
| 10 | Bi—Sn—Ag (57.0:42.0:0.5%) | 194 |
| 11 | Sn—Bi (57.0:43.0%) | 139 |
| 12 | In—Sn (52.0:48.0%) | 117 |

As a method of incorporating an alkali metal or an alkaline earth metal into the metallic alloy in Table 1 as base metal, there is usually a method of handling these air-combustible metals. For example, there is a method of melting, mixing and cooling them in a vacuum heating furnace or in a heating furnace whose atmosphere was replaced by an inert gas such as a nitrogen, an argon, or the like.

The amount of the alkali metal or alkaline earth metal added for attaining a higher electron injection function is 0.01 to 1%, preferably 0.05 to 0.5% by volume or weight, relative to the base metal-metal alloy, and the melting point of the base metal-metal alloy does not change. The alkali metal or alkaline earth metal is selected preferably from the group composed of Ca, Li, Cs, Mg and Sr.

In the present invention, the manufacturing method shown in any of FIGS. 1 to 6 is used in order that the metal alloy shown in Table 1, or a metal having an alkali metal or alkaline earth metal contained in the metal alloy, is formed as an electrode. Hereinafter, the manufacturing method is described with reference to the organic EL element for easier understanding. In the present invention, the same site is indicated by using the same symbol.

Figure 4A:
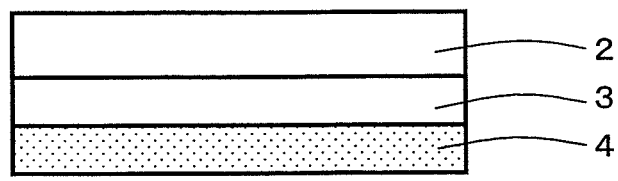
FIGS. 4A to 4C are a view showing another method for manufacturing the organic EL element of the present invention.
Figure 4B:
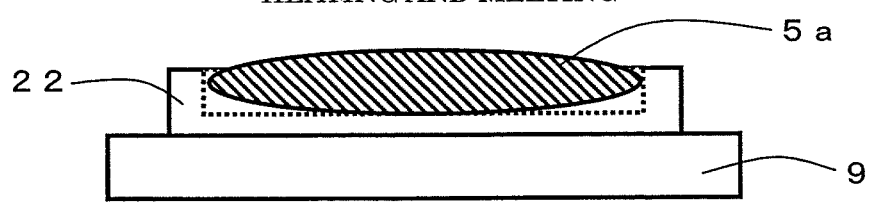
Figure 4B:
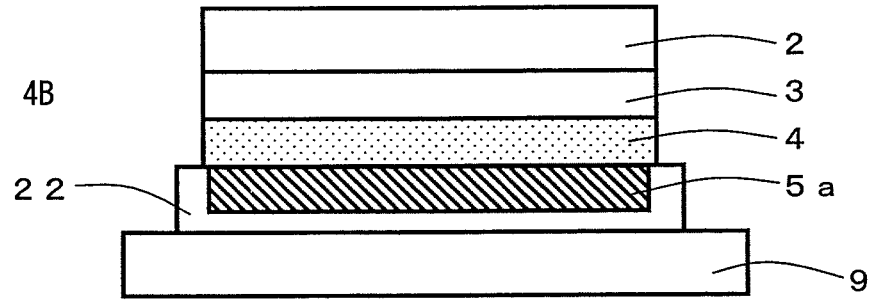
Figure 4C:
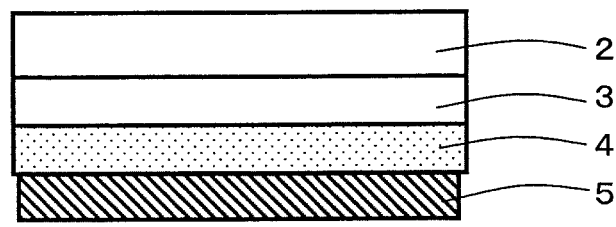

FIGS. 1A to 1D show an example of the method for manufacturing the organic EL element 1 of the present invention, wherein a metal constituting a cathode 5 is melted on a light emitting layer 4. FIGS. 2A to 2D show another manufacturing method for forming the organic EL element 1 of the present invention, wherein a molten metal 5a constituting a cathode 5 is coated on a light emitting layer 4. FIGS. 3A to 3D show a view describing the manufacturing method of the present invention for forming the organic EL element 1 of the present invention, wherein a metal paste 5b constituting a cathode 5 is coated on a light emitting layer 4, and the metal is melted to form an electrode. FIGS. 4A to 4C show another example of the manufacturing method of the present invention for forming the organic EL element 1 of the present invention, wherein a molten metal 5a constituting a cathode 5 is maintained in a base material 22 having a concave part and is opposed to a substrate 2 that has formed a light emitting layer 4, such that the molten metal 5a is contacted with, and transferred to, the light emitting layer 4. FIGS. 5A to 5D show another example of the manufacturing method of the present invention for forming the organic EL element 1 of the present invention, wherein a gap 22a is formed between a light emitting layer 4 and an opposite base material 22 having a concave part, and vacuum injection composed of evacuating the gap 22a and its surrounding predetermined space and then opening the surrounding space onto the air is carried out in this order, whereby the a molten metal 5a constituting a cathode is injected through a provided opening part 23 into the gap 22a. FIGS. 6A to 6D show another example of the manufacturing method of the present invention for forming the organic EL element 1 of the present invention, wherein a gap 22a is formed between a light emitting layer 4 and an opposite base material 22 having a concave part, and the gas in the gap 22a is suctioned, whereby a molten metal 5a constituting a cathode is injected thorough a provided opening part 23 into the gap 22a.

In FIGS. 1 to 6, 2 is a substrate, 3 is an anode (transparent electrode), and 9 is a hot plate.

The manufacturing method shown in FIGS. 1A to 1D is a method wherein the cathode 5—forming metal arranged on the light emitting layer 4 is heated, melted and cooled with a hot plate 9 or the like. The electrode can be produced with simple facilities, but is easily made thicker. When the thickness is increased, the organic EL layer, that is, an organic material is significantly different in expansion and shrinkage coefficients from the electrode metal, so the electrode may be released or contact failure in the interface between the organic EL layer and the electrode may be caused.

The manufacturing methods shown in FIGS. 2A to 2D and 3A to 3D are advantageous in their easy regulation of the thickness of the electrode. The thickness of the electrode is preferably 50 μm or less, more preferably 20 μm or less.

In the manufacturing method wherein the molten metal constituting the cathode 5 is applied onto the light emitting layer 4 in the organic EL element 1 of the present invention, for example, the molten metal 5a can be applied in an arbitrary shape with a dispenser 10, as shown in FIGS. 2A to 2D. In this case, a heated part of a nozzle or the like of the dispenser 10 is made desirably of a stable metal such as SUS.

In the present invention, the metal can be formed into fine particles having a diameter of 50 μm or less and dispersed in a resin binder to prepare a metal paste 5b.

The manufacturing method of the present invention, as compared with a conventional method of thermally curing only a resin in a metal paste, can be said to be a method for manufacturing an organic EL element excellent in emission characteristics because melting the metal particles themselves by heating the metal paste 5b after application can further improve electrical conductivity and the adhesion to the light emitting layer, and can increase the binding of the light emitting layer/cathode interface at the molecular level. As shown in the manufacturing method of the present invention in FIGS. 3A to 3D, the metal paste 5b can be applied for example by screen printing or the like.

In FIGS. 3A to 3D, 11 is a screen plate, and 12 is a squeegee.

The organic EL elements formed in the air by these manufacturing methods are superior in emission characteristics such as voltage and brightness, but are poor in uniformity. The electrode having a certain area generates uneven light emission easily in the plane, and it is estimated that an oxide film is formed on the surface of the electrode with which the light emitting layer is contacted. For improving uniformity, the electrode is formed preferably inside a glove box whose atmosphere is replaced by an inert gas such as a nitrogen or an argon, but in the manufacturing methods in FIGS. 1A to 1D, 2A to 2D and 3A to 3D, there remains the following problem. Formation of an oxide film can be prevented by low water and oxygen concentrations in the glove box, but because of the low water concentration, the contact angle of the molten metal in a form similar to liquid is significantly increased so that the metal is repelled on the light emitting layer to make electrode formation difficult.

The manufacturing method of the present invention in FIGS. 4A to 4C can form an electrode even if the contact angle is high, and thus this method is effective for improvement in uniformity. By this method, the electrode can be easily formed with an arbitrary shape and thickness depending on the shape of the concave part of the base material 22 having a concave part.

In the present invention, the base material 22 having a concave part for molding the electrode may be released to transfer the electrode. Alternatively, according to this method, the base material 22 having a concave part can be left and used as a sealing material by which the organic functional material to be easily deteriorated with water and an oxygen can be separated from the air.

In the manufacturing method of the present invention in FIGS. 5A to 5D, the gap 22a is formed by arranging the base material 22 pre-forming a concave part opposite to the light emitting layer 4. This state is defined as empty element. This method is as follows: the empty element is provided with the opening part 23 and the molten metal 5a is arranged in the opening part 23; for example, the empty element is arranged inside a container to evacuate the whole of the container followed by opening the container to the air to make a difference in pressure between the inside and outside of the empty element; and this difference in pressure is utilized to form the metal electrode 5 (vacuum vapor deposition). The element emitting a light of higher uniformity can thereby be obtained. The gap 22a is formed usually with a narrow width of 1 mm or less, and the molten metal 5a is passed through this narrow gap thereby generating convection so that the alkali metal not deteriorated in the alloy is introduced uniformly onto the surface of the light emitting layer 4 to form the metal electrode 5, which is considered to lead to emission of a light of higher uniformity.

In the manufacturing method of the present invention in FIGS. 6A to 6D, the gap 22a is formed by pre-arranging the base material 22 having a concave part opposite to the light emitting layer 4. This state is defined as empty element. The empty element is provided with a plurality of opening parts 23 and the molten metal 5a is arranged in the opening part 23, the gas in the empty element is suctioned through another opening part 23, to form the metal electrode 5. Formation of the electrode by suction of the gas from the gap is conducted preferably in an inert gas such as a nitrogen, an argon, or a mixed gas of a nitrogen and an argon. By producing the electrode inside a glove box, the element emitting a higher uniform light can be obtained. The molten metal is passed through the narrow gap thereby generating convection so that the alkali metal not deteriorated in the alloy is introduced uniformly onto the surface of the light emitting layer 4 to form the metal electrode 5, which is considered to lead to emission of a light of higher uniformity.

In FIGS. 6A to 6D, 24 indicates the suction of gas.

In the vacuum injection method described above, the vacuum container is arranged in an inert gas environment to prevent the element from being exposed to the air, which is more effective for reliability and so on of the element for a long time.

In FIGS. 5A to 5D and 6A to 6D, the opening part 23 is formed in the opposite base material 22 having a concave part, but a part of a sealing material for bonding the base material 22 having a concave part opposite to the substrate 2 provided with the light emitting layer 4 may be opened.

In FIGS. 5 A to 5D and 6 A to 6D, the molten metal 5a closing the opening part 23 can be cooled and hardened to attain a sealing effect simultaneously. FIG. 5D shows one example of the organic EL element 1 from which the base material 22 having a concave part was removed. FIG. 6D shows one example of the organic EL element 1 wherein the opening part 23 is sealed with the cooled and hardened molten metal 5a, and the base material 22 having a concave part remains as a sealing material.

Figure 6A:
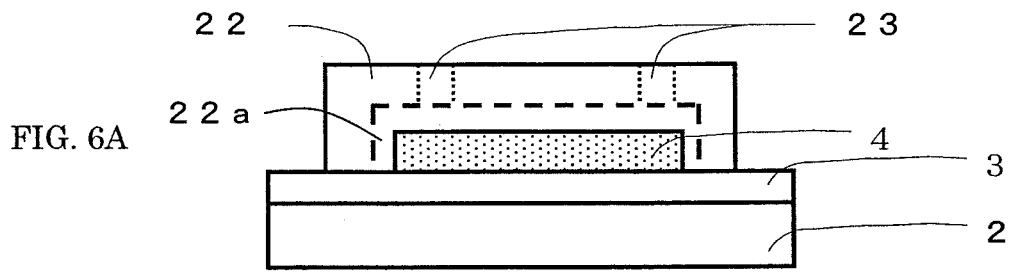
FIGS. 6A to 6D are a view showing another method for manufacturing the organic EL element of the present invention.
Figure 6B:
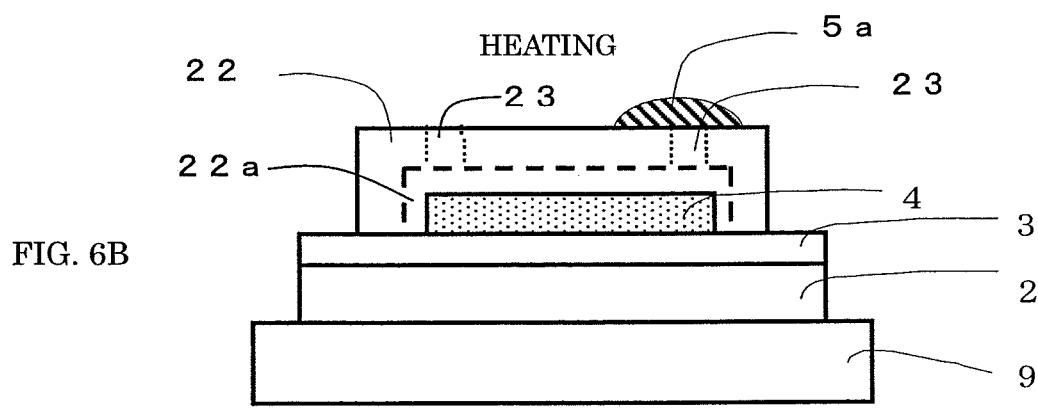
Figure 6C:
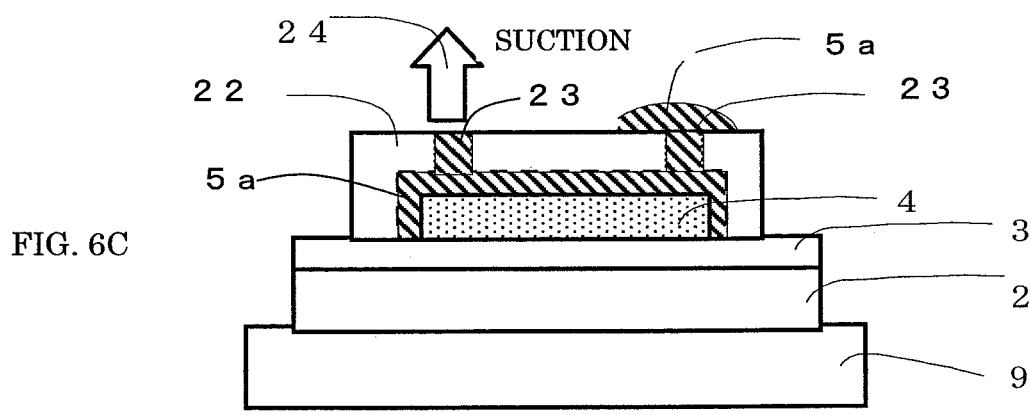
Figure 6D:
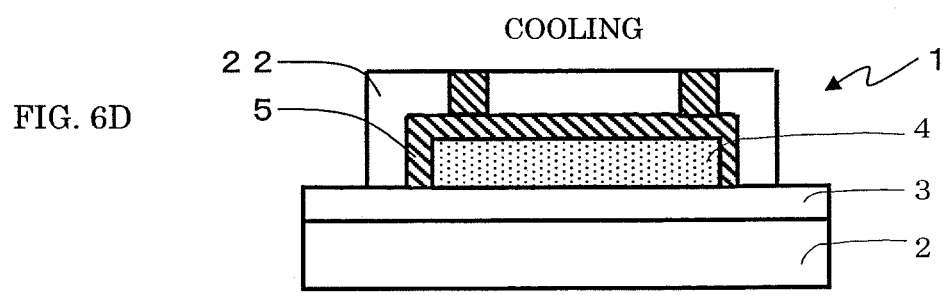
Figure 7:
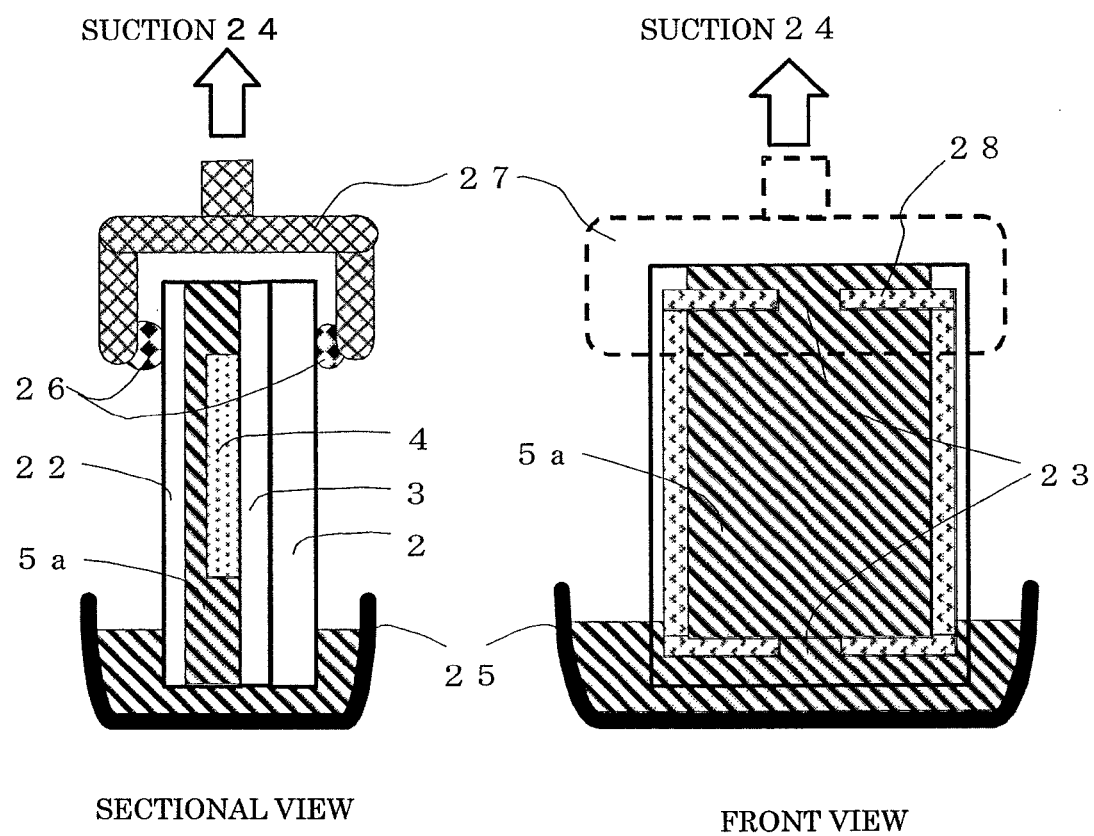
FIG. 7 is a view showing the method for manufacturing the organic EL element of the present invention shown in FIG. 6.

The manufacturing method in FIGS. 6 A to 6D is more practically conducted in a manufacturing method shown for example in FIG. 7. One of opening parts 23 of an empty element composed of a sealing material 28 is sealed with a partition wall member 27 provided with a packing 26, and the other opening part 23 is dipped in a heat-resistant container 25 maintaining a molten metal 5a to suction the inside of the empty element thereby enabling large-scale production of the metal electrode having a large area.

Figure 8:
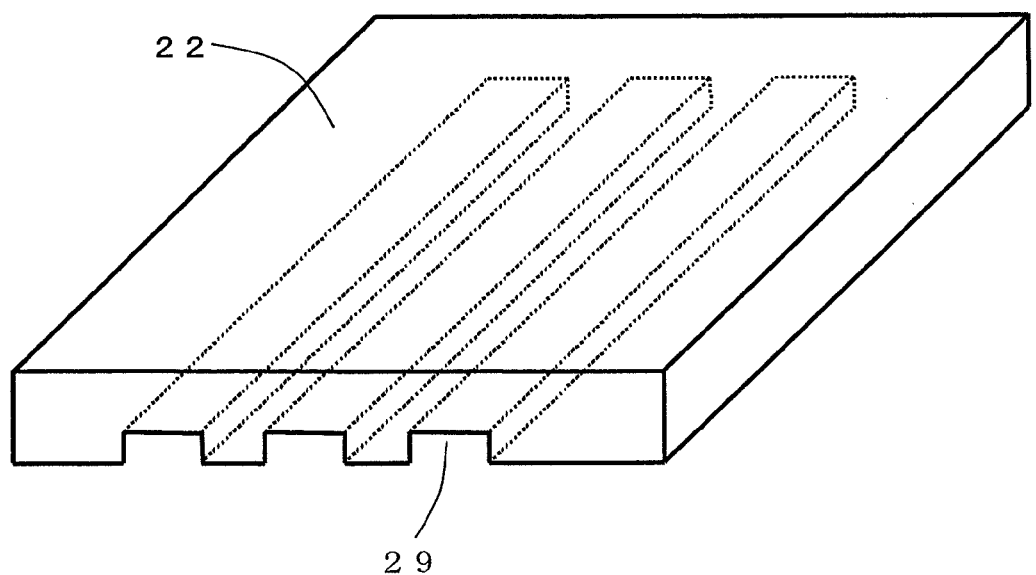
FIG. 8 is a view showing the method for manufacturing the organic EL display apparatus of the present invention.

The manufacturing methods in FIGS. 4A to 4C, 5A to 5D and 6A to 6D can form the electrode having an arbitrary shape depending on the shape of the base material 22 having a concave part. Particularly as shown in FIG. 8, a base material 22 having a concave part including a striped part 29 forming a plurality of striped concave-convex in a striped pattern is effective in forming a pixel electrode for constituting a display apparatus. In consideration of productivity and cost of the base material 22 having a concave part, its material is preferably a member selected from the group composed of a glass, a ceramics and a resin or a composite material of two or more thereof.

As described above, it is known that the organic EL element is provided with a hole injection layer or an electron injection layer in addition to the light emitting layer thereby significantly improving emission characteristics and longevity.

As the hole injection layer, materials such as water-soluble PEDOT/PSS (polyethylene dioxythiophene/polystyrene sulfonate) usable in forming the layer by coating are known. The coatable light emitting material is as described above.

Using these solution materials and the cathode of the present invention, a high-performance organic EL element capable of forming all layers can be prepared without using vapor deposition, as shown in FIGS. 12A to 12E. In FIGS. 12A to 12E, 1 is an organic EL element, 2 is a substrate, 3 is an anode (transparent electrode), 4 is a light emitting layer, 5 is a cathode (metal electrode), 6 is a hole injection (transport) layer, and 7 is an electron injection (transport) layer.

Figure 10A:
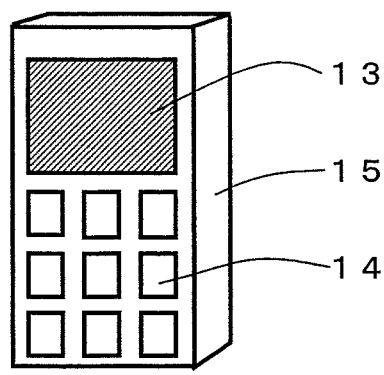
FIGS. 10A to 10D are examples of an electronic apparatus in which the display apparatus of the present invention was installed.
Figure 10B:
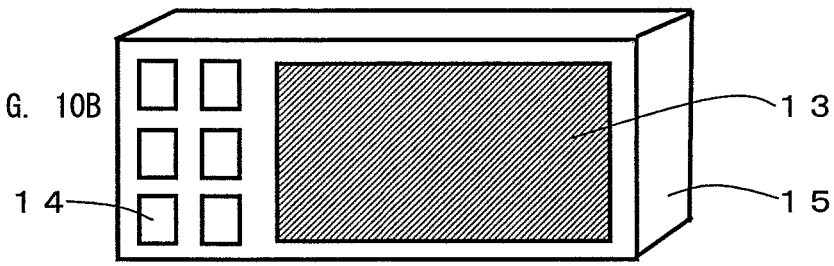
Figure 10C:
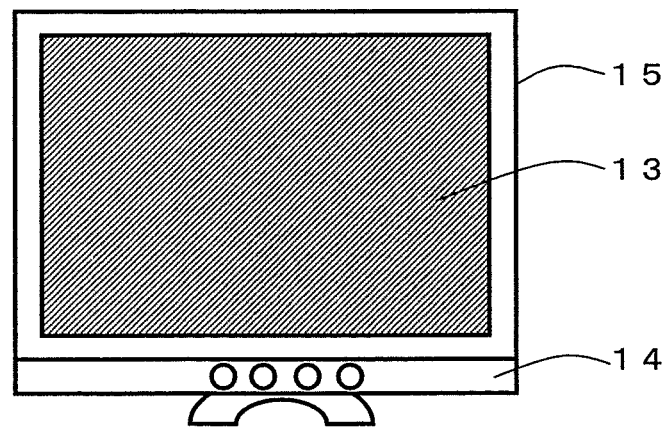
Figure 10D:
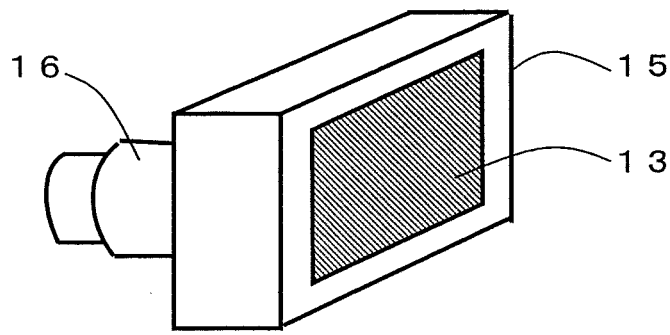
Figure 11A:
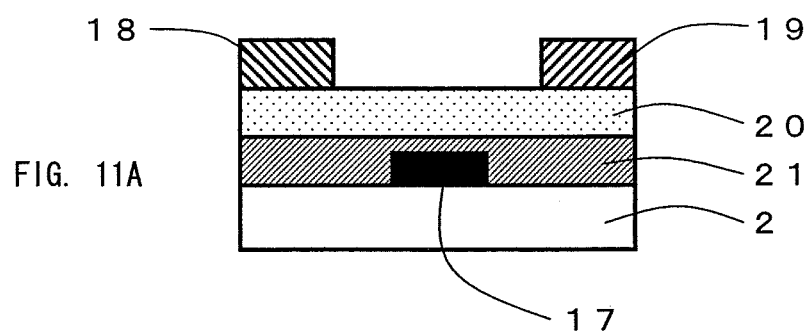
FIGS. 11A to 11C are sectional structural views of the TFT elements of the present invention in the Examples.
Figure 11B:
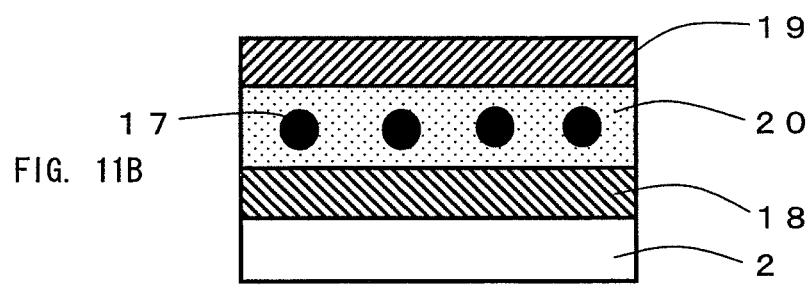
Figure 11C:
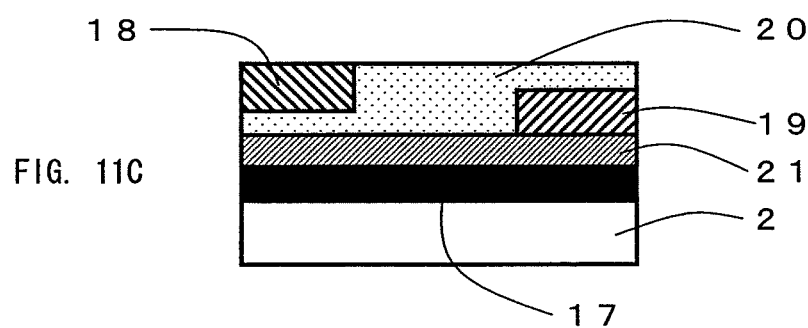
Figure 12A:
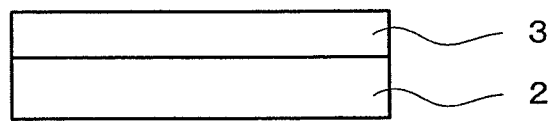
FIGS. 12A to 12E are a view showing the constitution of the organic EL element of the present invention and the process for manufacturing the same.
Figure 12B:
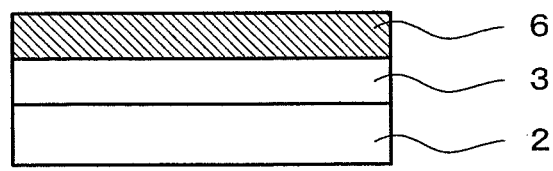
Figure 12C:
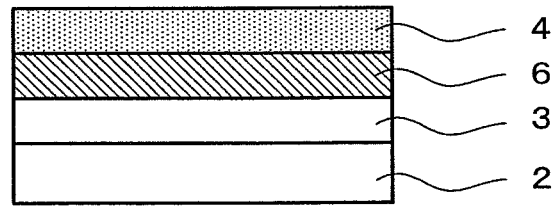
Figure 12D:
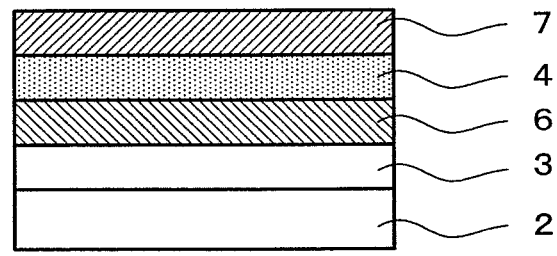
Figure 12E:
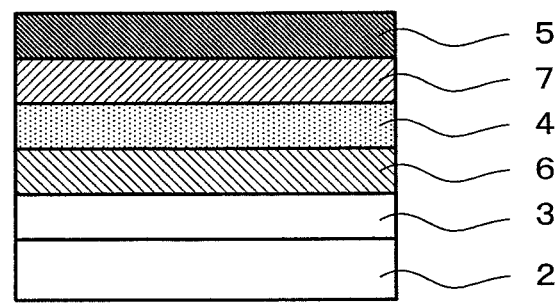

As shown in FIGS. 10A to 10D, a cellular phone equipped with operation part 14, PDA (personal digital assistant) type terminal, PC (personal computer), a TV set, a video camera, a digital camera, and others can be provided as an apparatus 15 carrying, as display 13, the display apparatus provided by using the present invention. In FIG. 10D, 16 is a lens part.

The present invention is not limited to the embodiments. The embodiments are merely examples, and any one having the substantially same configuration as the technological idea disclosed in the claims of the present invention and the same effects is included in the technological scope of the present invention.

The present invention has been described above, and the present invention will be described in more detail with reference to the examples.

EXAMPLES

Example 1

The following solution was prepared in the example of the present invention.

| <Preparation of organic EL layer-forming coating solution> | |
| --- | --- |
| Polyvinyl carbazole | 70 parts by weight |
| Oxadiazole compound | 30 parts by weight |
| Fluorescent dye | 1 part by weight |
| Monochlorobenzene (solvent) | 4900 parts by weight |

When the fluorescent dye is coumarin 6, a green emission having a peak at 501 nm was obtained; in the case of perylene, a blue emission having a peak at 460 to 470 nm was obtained; and in the case of DCM (dicyanomethylene pyran derivative), a red emission having a peak at 570 nm was obtained. These were used as light emitting materials of the respective colors.

<Preparation of EL Display Element>

Figure 9:
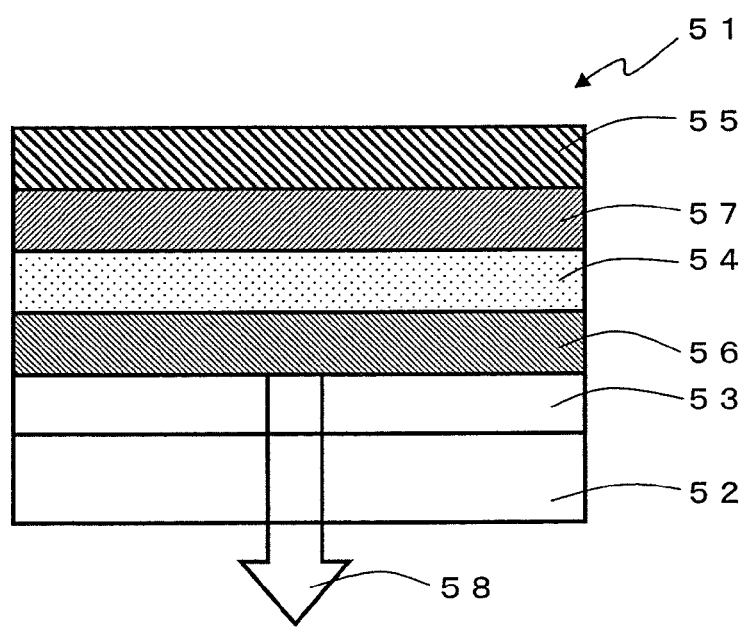
FIG. 9 is a schematic view showing a sectional structure of a conventional organic EL element.

An organic EL element having a sectional shape shown in FIG. 9 was manufactured. A substrate 52 was glass, and a transparent electrode 53 was ITO of 200 nm in thickness. After the substrate 52 was washed, PEDOT/PSS (Bayer CH8000 manufactured by Bayer AG) was applied as a hole injection layer 56 to a thickness of 80 nm by spin coating and formed by baking at 160° C.

Then, the above red organic EL layer-forming coating solution was applied to a thickness of 80 nm by spin coating on PEDOT and then formed by baking at 130° C.

Subsequently, a metal (alloy) having a Bi—Pb—Sn (50:25:25%) composition over a substrate 2 having layers formed until a light emitting layer 4 as shown in FIGS. 1A to 1D was heated with a hot plate 9 at 98° C. higher by 5° C. than the melting point of the metal alloy, and the metal was melted on the light emitting layer 4 to form a cathode 5.

The shape and thickness of the electrode varied depending on the size and thickness of the metal alloy ingot arranged on the light emitting layer.

When the element with ITO as an anode and the metal electrode as a cathode was driven by a direct current, emission was initiated at 3.6 V, and the emission intensity at 7.2 V had a brightness of 100 cd/m$^2$.

Comparative Example 1

An element with the same constitution as in Example 1 was manufactured except that Al was vapor-deposited as the cathode. The element initiated light emission at 3.4 V and had emission intensity with a brightness of 100 cd/m$^2$ at 7.1 V, indicating almost the same emission characteristics as those of the element in Example 1. As a result, it was confirmed that the EL display element in Example 1 has emission element characteristics equivalent to those of the element manufactured by the vapor deposition method.

Comparative Example 2

An element with the same constitution as in Example 1 was manufactured except that as the cathode, a solventless two component epoxy resin-type silver paste was applied and baked at 175° C. Silver was not melted, the adhesion to the light emitting layer was not strong, and the light emitting layer was affected by heating at high temperatures, and desired emission characteristics could not be obtained.

Comparative Example 3

An element with the same constitution as in Comparative Example 2 was manufactured except that the baking was carried out at 130° C., but desired emission characteristics could not be obtained. This is probably because although the light emitting layer was not affected by heating, silver was not melted and the adhesion to the light emitting layer was not strong.

Example 2

The same element as in Example 1 was manufactured except that the metal of the cathode was an alloy of Bi—Pb—Sn (50.0:31.2:18.8%).

Example 3

The same element as in Example 1 was manufactured except that the metal of the cathode was an alloy of Bi—Pb—Sn (50.0:28.0:22.0%).

Example 4

The same element as in Example 1 was manufactured except that the metal of the cathode was an alloy of Bi—Pb—Sn—Cd (40.0:40.0:11.5:8.5%).

Example 5

The same element as in Example 1 was manufactured except that the metal of the cathode was an alloy of Bi—Pb—Sn—Sb (47.7:33.2:18.8:0.3%).

Example 6

The same element as in Example 1 was manufactured except that the metal of the cathode was an alloy of Bi—Pb—Sn—Cd (50.0:26.7:13.3:10.0%).

Example 7

The same element as in Example 1 was manufactured except that the metal of the cathode was an alloy of Bi—Pb—Sn—Cd (50.0:25.0:12.5:12.5%).

Example 8

The same element as in Example 1 was manufactured except that the metal of the cathode was an alloy of Bi—Cd (60.0:40.0%).

Example 9

The same element as in Example 1 was manufactured except that the metal of the cathode was an alloy of Bi—Cd—In (60.0:35.5:5.0%).

Example 10

The same element as in Example 1 was manufactured except that the metal of the cathode was an alloy of Sn—Bi (57.0:43.0%).

Example 11

The same element as in Example 1 was manufactured except that the metal of the cathode was an alloy of In—Sn (52.0:48.0%).

In Examples 2 to 11, the heating temperature of the substrate was a temperature higher by 5° C. than the melting point of each metal. In any elements, the voltage at which emission was initiated was 3.6 to 3.7 V, and the voltage at which the emission had, a brightness of 100 cd/m$^2$ was 7.2 to 7.4 V, and the emission characteristics were almost the same as in the element in Example 1.

Example 12

Ca was mixed with, and contained in an amount of 0.04% by volume, in the alloys in Examples 1 to 11. Both the metals were melted, mixed and cooled by an electric furnace of a nitrogen replacement type. The melting points of the resulting alloys were the same as that of the base metal alloy.

The same elements as in Examples 1 to 11 were manufactured except that the above metal was used as the cathode. The heating temperature of the substrate was a temperature higher by 5° C. than the melting point of each metal. In any elements, the voltage at which emission was initiated was 2.0 to 2.1 V, and the voltage at which the emission had a brightness of 100 cd/m$^2$ was 5.3 to 5.5 V, and the resulting elements had higher brightness at lower voltage than the elements in Examples 1 to 11.

Comparative Example 4

A element with the same constitution as in Examples 12 was manufactured except that CaAl was continuously vacuum vapor deposited as the cathode. The voltage at which emission was initiated was 2.0 V, and the emission intensity at 4.0 V was a brightness of 100 cd/m$^2$.

Example 13

The same elements as in Examples 12 were manufactured except that Ca was mixed and contained in amounts of 0.1 and 0.5% by volume respectively. In any elements, the voltage at which emission was initiated was 2.0 to 2.1 V, the voltage at which the element emitted a light with a brightness of 100 cd/m$^2$ was 3.9 to 4.1 V; the emission characteristics could be improved for lower voltage and higher brightness than in Example 12; and it was confirmed that the same emission characteristics similar to those of the vapor-deposited Ca element in Comparative Example 4 could be exhibited.

Example 14

The same element as in Examples 13 was manufactured except that Ca was mixed and contained in the same ratio by weight as in Example 13.

The same voltage/brightness characteristics as in Example 13 were indicated, and it was confirmed that emission characteristics similar to those of the vapor-deposited Ca element in Comparative Example 4 could be exhibited.

Example 15

The same elements as in Examples 13 and 14 were manufactured except that Li, Cs, Mg or Sr was used in place of Ca.

Any elements exhibited the same voltage/brightness characteristics as in Examples 13 and 14, and it was confirmed that excellent emission characteristics could be exhibited by using these alkali metals and alkaline earth metals.

Comparative Example 5

An element with the same constitution as in Comparative Examples 4 was manufactured except that a blue-light emitting layer was used as the light emitting layer. Emission was initiated at 2.0 V, and the emission intensity at 5.8 V was a brightness of 100 cd/m$^2$.

Comparative Example 6

An element with the same constitution as in Comparative Example 5 was manufactured except that LiAl was continuously vacuum vapor deposited as the cathode. Emission was initiated at 2.0 V, and the emission intensity at 3.8 V was a brightness of 100 cd/m$^2$. It was confirmed that for the blue-light emitting layer, Li is superior to Ca as the electron injection layer.

Example 16

The same elements as in Comparative Examples 5 and 6 were manufactured except that the metals containing Ca and Li respectively in Examples 13 and 14 were used as the cathode. The Ca-containing metal element gave the same emission characteristics as in Comparative Example 5, and the Li-containing metal element gave the same emission characteristics as in Comparative Example 6.

Example 17

The metals produced in Examples 1 to 16 were left in the air, and after one month, the same elements were produced using the metals. Any of the elements could reproduce the initial characteristics. It was confirmed that the usually unstable alkali metals and alkaline earth metals, when contained in the other metals, could be stably stored.

Example 18

The same elements as in Examples 1 to 11 were manufactured in the same manner except that dispenser coating was used to form the cathode. Using an SUS syringe, the metal molten at a temperature higher by 5° C. than the melting point of each metal was applied directly onto the light emitting layer by a dispenser. The thickness of the coating was set to be 20 μm.

In any elements, emission was initiated at the voltage of 3.6 to 3.7 V, and the voltage at which a light was emitted at a brightness of 100 cd/m$^2$ was 7.2 to 7.4 V, which was almost the same as in the elements as in Examples 1 to 11, indicating almost the same emission characteristics. In this example, the thickness of the electrode could be regulated to be thinner in addition to the advantages in Examples 1 to 11, and thus the emission uniformity of the light emitting surface was improved. Also, the shape of the electrode could be arbitrarily regulated, so the degree of completion thereof as the light emitting element was significantly improved.

Example 19

The same elements as in Examples 1 to 11 were manufactured in the same manner except that screen printing was used to form the cathode. Fine particles of each metal were dispersed in a resin binder to form a paste and then printed on the light emitting layer. Printing conditions were established such that the thickness of the completed cathode became 20 μm. After printing, the substrate was heated to a temperature higher by 5° C. than the melting point of each metal thereby melting the metallic particles in the paste followed by cooling to form a cathode.

In any elements, emission was initiated at the voltage of 3.6 to 3.7 V, and the voltage at which a light was emitted at a brightness of 100 cd/m$^2$ was 7.2 to 7.4 V, which was almost the same as in the elements as in Examples 1 to 11, indicating almost the same emission characteristics. In this example, the thickness of the electrode could be regulated to be thinner in addition to the advantages in Examples 1 to 11, and thus the emission uniformity of the light emitting surface was improved. Also, the shape of the electrode could be arbitrarily regulated, so the degree of completion thereof as the light emitting element was significantly improved.

Example 20

The same elements as in Examples 18 and 19 were manufactured in the same manner as in Examples 18 and 19 except that the method in FIGS. 4A to 4C inside a glove box was used to form the cathode. The base material having a concave part was made of glass.

In any elements, emission was initiated at the voltage of 3.6 to 3.7 V, and the voltage at which a light was emitted at a brightness of 100 cd/m$^2$ was 7.2 to 7.4 V, which was almost the same as in the elements as in Examples 18 and 19, indicating almost the same emission characteristics. In this example, the elements can be manufactured inside the glove box in addition to the advantages in Examples 18 and 19, and thus the emission uniformity of the light emitting surface was further improved. Also, the shape of the electrode could be arbitrarily regulated, so the degree of completion thereof as the light emitting element was further significantly improved.

Example 21

Figure 5A:
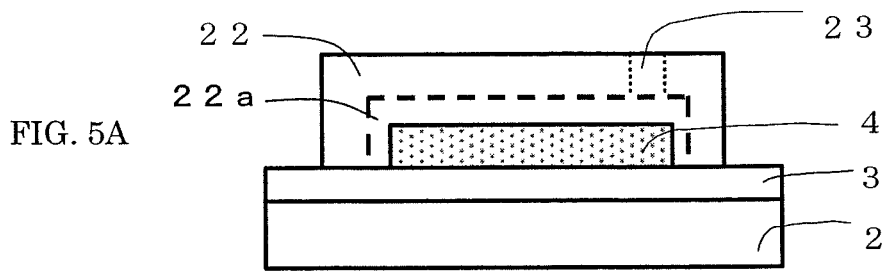
FIGS. 5A to 5D are a view showing another method for manufacturing the organic EL element of the present invention.
Figure 5B:
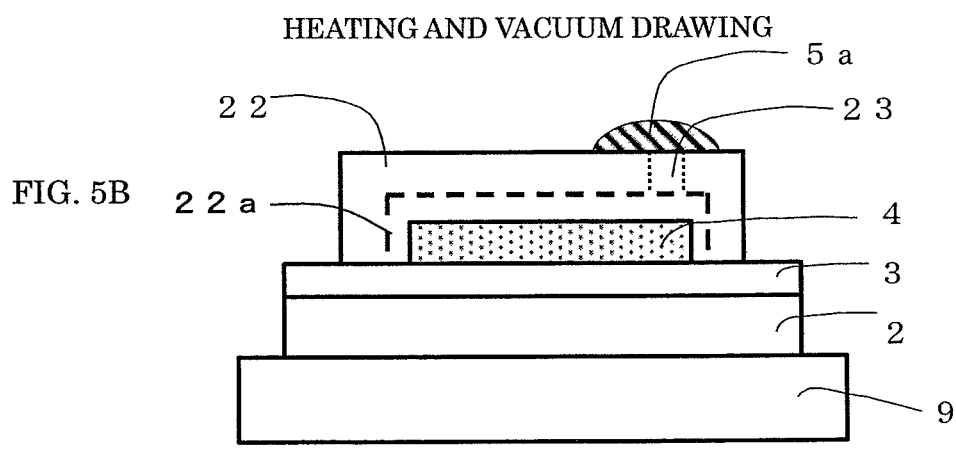
Figure 5C:
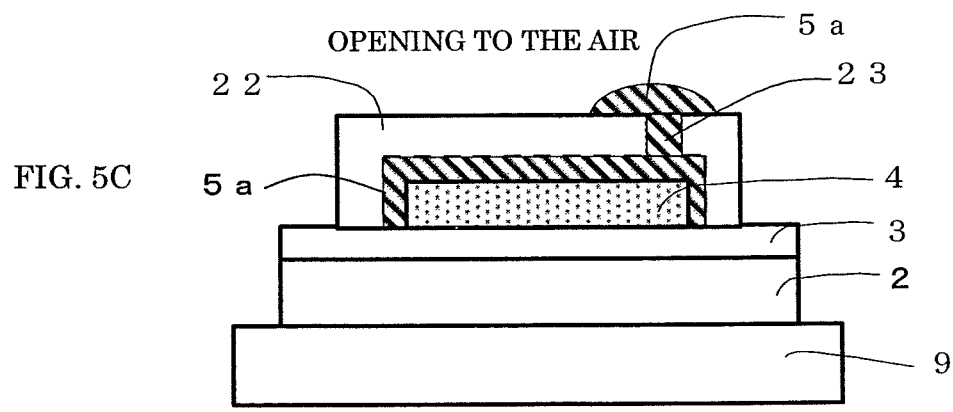
Figure 5D:
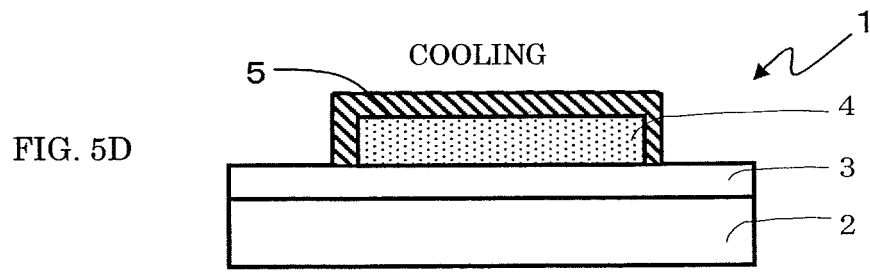

The same elements as in Examples 18 and 19 were manufactured in the same manner as in Examples 18 and 19 except that the vacuum injection method in FIGS. 5A to 5B was used to form the cathode. The base material having a concave part constituting a gap was made of glass. The base material was bonded via UV sealing to the substrate having a light emitting layer formed thereon to prepare an empty element. The elements having a gap of 5 to 500 μm were prepared, and in any of the elements, emission was initiated at the voltage of 3.6 to 3.7 V, and the voltage at which a light was emitted at a brightness of 100 cd/m$^2$ was 7.2 to 7.4 V, which were almost the same emission characteristics as in the elements as in Examples 18 to 19. In this example, the elements could be manufactured under vacuum in addition to the advantages in Examples 18 to 19, so the emission uniformity of the light emitting surface was further improved, and the shape of the electrode could be arbitrarily regulated, so the degree of completion thereof as the light emitting element was further significantly improved. The molten metal was cooled and hardened to close the opening part thereby achieving sealing simultaneously to complete the element.

Example 22

The same elements as in Examples 18 and 19 were manufactured in the same manner as in Examples 18 and 19 except that the suction method in FIGS. 6A to 6D inside a glove box was used to form the cathode. The base material having a concave part constituting a gap was made of glass. The substrate was bonded by UV sealing to the substrate having a light emitting layer formed thereon to prepare an empty element. The elements having a gap of 5 to 500 μm were prepared, and in any of the elements, emission was initiated at 3.6 to 3.7 V, and the voltage at which a light was emitted at a brightness of 100 cd/m$^2$ was 7.2 to 7.4 V, which were almost the same emission characteristics as in the elements as in Examples 18 and 19. In this example, the elements could be manufactured under vacuum in addition to the advantages in Examples 18 to 19, so the emission uniformity of the light emitting surface was further improved, and the Shape of the electrode could be arbitrarily regulated, so the degree of completion thereof as the light emitting element was further significantly improved. The molten metal was cooled and hardened to close the opening part thereby achieving sealing simultaneously to complete the element.

Example 23

Elements were manufactured in the same manner as in Examples 20, 21 and 22 except that the base material used was provided with a plurality of concave parts in a striped pattern as shown in FIG. 8. A plurality of elements having a line width of 50 to 300 μm and a line interval of 10 to 30 μm were manufactured. Any of the elements exhibited the emission characteristics corresponding to the striped shape, and it was confirmed that these could be used as electrodes for display apparatuses.

Example 24

The same element as in Example 20 was manufactured except that the cathode in each of Examples 12 to 16 was used.
Any elements had the same emission characteristics as in Examples 12 to 16. According to this example, the emission uniformity of the light emitting surface was improved, and the shape of the electrode could be arbitrarily regulated, so the degree of completion thereof as the light emitting element was significantly improved.

Example 25

The same element as in Example 21 was manufactured except that the cathode in each of Examples 12 to 16 was used.
Any elements had the same emission characteristics as in Examples 12 to 16. According to this example, the emission uniformity of the light emitting surface was improved, and the shape of the electrode could be arbitrarily regulated, so the degree of completion thereof as the light emitting element was further significantly improved. This is considered due to the effect of surface introduction of the alkali metal component by running through the gap.

Example 26

The same element as in Example 22 was manufactured except that the cathode in each of Examples 12 to 16 was used.
Any elements had the same emission characteristics as in Examples 12 to 16. According to this example, the emission uniformity of the light emitting surface was improved, and the shape of the electrode could be arbitrarily regulated, so the degree of completion thereof as the light emitting element was further significantly improved. This is considered due to the effect of surface introduction of the alkali metal component by running through the gap.

Example 27

The same element as in Example 23 was manufactured except that the cathode in each of Examples 12 to 16 was used. Any elements exhibited the same emission characteristics as in Examples 20, 21 and 22 as well as the emission characteristics corresponding, to the uniform striped shape, and it was confirmed that these could be used as practical electrodes for display apparatuses.

Example 28

A thin film transistor (TFT) element was manufactured by using an organic semiconductor. Agate electrode necessary for TFT and a gate insulating layer were formed on a substrate. The gate electrode was Cr, the gate insulating layer was $SiO_2$, and polythiophene, that is, an electroconductive polymer material, was applied as the semiconductor layer.
A usual flat electrode structure TFT element (FIG. 11A), a static induction type (SIT) TFT element (FIG. 11B), and a top-and-bottom contact type TFT element (FIG. 11C) having the structures shown in FIGS. 11A to 11C respectively were manufactured. In FIGS. 11A to 11C, 2 is a substrate, 17 is a gate electrode, 18 is a source electrode, 19 is a drain electrode, 20 is an organic semiconductor layer, and 21 is an insulating layer.
The metal in each of Examples 1 to 17 was used as the electrode formed on the organic semiconductor layer, and Bi—Sn—Ag (57.5:42.0:0.5%) and Ca, Li, Cs, and Sr were added in the same amounts as in the Examples above, and each of the resulting metals was used. The melting point was 194° C. which the same as that of the base metal was. The glass transition temperature of the polythiophene is higher than that of the organic EL material mentioned above, so an electrode material metal of higher melting point can be selected. Elements were manufactured by using the methods for manufacturing the electrode in these examples and the methods for manufacturing the electrode in Examples 18 to 22 and Example 24 to 26.
In the TFT elements of any structures, an electric current running between the source electrode and the drain electrode was changed depending on a change in gate voltage, to confirm the transistor operation.
Hereinbefore, the examples of the invention have been described in detail, but the present invention is not limited thereto.

Industrial Applicability

According to the present invention, an electrode is formed on an organic material layer without using a vacuum film making method such as vapor deposition, whereby organic functional elements, particularly an organic EL element, an organic TFT element, or the like can be manufactured, and these functional elements can be large-sized easily and produced at lower cost. The organic material layer is not affected during formation of the electrode, and the organic functional element having high reliability without being affected by environmental changes can be realized.
The organic functional element of the present invention can be manufactured under vacuum or in an inert gas. Thus, the emission uniformity of the light emitting surface can be further improved, and the shape of the electrode can be arbitrarily regulated, thereby improving the degree of completion as the light emitting element. The element can also be completed by cooling and hardening a molten metal to close opening parts thereby simultaneously performing sealing.

What is claimed is:

1. A method for manufacturing an organic functional element comprising:
   an organic functional element providing step of providing at least a plurality of electrodes and an organic material layer, wherein at least one of the electrodes is composed of a metal having a melting point of 70° or higher to 160° or lower,
   a base material providing step of providing a base material having a concave part and an opening part penetrating from the concave part side to the opposite side of the concave part,
   a gap providing step of providing a gap between the organic material layer and the base material by arranging the base material so that the concave part and the opening part of the base material face the organic material layer,
   a metal injecting step of injecting the molten metal constituting the at least one of the electrodes through the opening part into the gap after the gap providing step, and
   an electrode forming step of cooling the molten metal constituting the at least one of the electrodes and injected in the gap to form the at least one of the electrodes after the metal injecting step.

2. The method according to claim 1, further comprising a vacuum injection method composed of arranging the metal in the opening part, evacuating the gap and its surrounding predetermined space, and opening the surrounding space onto air in this order is carried out to inject the metal into the gap and thereby forming the electrode.

3. The method according to claim 2, further comprising the steps of arranging the metal in the opening part and suctioning a gas in the gap through another opening part not provided with the metal to inject the metal into the gap and thereby form the electrode.

4. The method according to claim 3, wherein a formation of the electrode by the vacuum injection method into the gap or a formation of the electrode by the suction of the gas in the gap is carried out in an inert gas.

5. The method according to claim 4, wherein the inert gas is nitrogen, argon, or a mixed gas of nitrogen and argon.

6. The method according to claim 1, further comprising the step of sealing the base material having the concave part with the opening part by cooling and hardening the molten metal.

* * * * *